United States Patent
Heimel et al.

(10) Patent No.: US 9,214,896 B2
(45) Date of Patent: Dec. 15, 2015

(54) FREQUENCY GENERATOR ASSEMBLY

(71) Applicant: Continental Teves AG & Co. OHG, Frankfurt (DE)

(72) Inventors: Jörg Heimel, Ingelheim (DE); Timo Dietz, Hochheim (DE); Gerhard Möheken, Usingen (DE); Stefan Günthner, Frankfurt (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 0 days.

(21) Appl. No.: 14/366,166

(22) PCT Filed: Dec. 10, 2012

(86) PCT No.: PCT/EP2012/074999
§ 371 (c)(1),
(2) Date: Jun. 17, 2014

(87) PCT Pub. No.: WO2013/092280
PCT Pub. Date: Jun. 27, 2013

(65) Prior Publication Data
US 2014/0347139 A1 Nov. 27, 2014

(30) Foreign Application Priority Data
Dec. 23, 2011 (DE) .......................... 10 2011 089 813

(51) Int. Cl.
*H03B 5/30* (2006.01)
*G01C 19/5776* (2012.01)
(Continued)

(52) U.S. Cl.
CPC .............. *H03B 5/30* (2013.01); *G01C 19/5776* (2013.01); *G06F 1/04* (2013.01); *H03L 1/02* (2013.01)

(58) Field of Classification Search
USPC ................................ 331/116 M, 66, 176, 154
See application file for complete search history.

(56) References Cited

U.S. PATENT DOCUMENTS

| | | | |
|---|---|---|---|
| 6,553,833 B1 * | 4/2003 | Funk et al. ................. | 73/504.14 |
| 6,995,622 B2 * | 2/2006 | Partridge et al. ................ | 331/66 |
| 7,679,466 B1 | 3/2010 | Cioffi et al. | |

(Continued)

FOREIGN PATENT DOCUMENTS

DE    10 2009 045 422    4/2011

OTHER PUBLICATIONS

International Search Report corresponding to application No. PCT/EP2012/074999, dated Mar. 21, 2013.

(Continued)

*Primary Examiner* — Joseph Chang
(74) *Attorney, Agent, or Firm* — RatnerPrestia

(57) ABSTRACT

The invention relates to a frequency generator assembly, including at least one oscillator and an electronic signal processing device, which is designed in such a way that the electronic signal processing device provides an electric clock signal (f) having a defined frequency as an output signal of the frequency generator assembly, wherein the defined frequency depends on the vibration frequency of the oscillator, wherein the oscillator includes at least one micromechanical seismic mass which is vibrationally excited by at least one driving device, whereupon the electronic signal processing device generates and provides the electric clock signal (f) according to the vibration frequency of the at least one seismic mass.

11 Claims, 1 Drawing Sheet

(51) Int. Cl.
*G06F 1/04* (2006.01)
*H03L 1/02* (2006.01)

(56) References Cited

U.S. PATENT DOCUMENTS

| | | | |
|---|---|---|---|
| 7,876,167 B1* | 1/2011 | McCraith et al. | 331/116 M |
| 2005/0160813 A1 | 7/2005 | Imai | |
| 2008/0030235 A1 | 2/2008 | Sun et al. | |
| 2010/0122577 A1* | 5/2010 | Neul et al. | 73/504.12 |
| 2011/0074517 A1 | 3/2011 | Mccraith et al. | |
| 2011/0285444 A1 | 11/2011 | Uemura et al. | |

OTHER PUBLICATIONS

German Search Report corresponding to application No. 10 2011 089 813.1, dated Jul. 13, 2012.

* cited by examiner

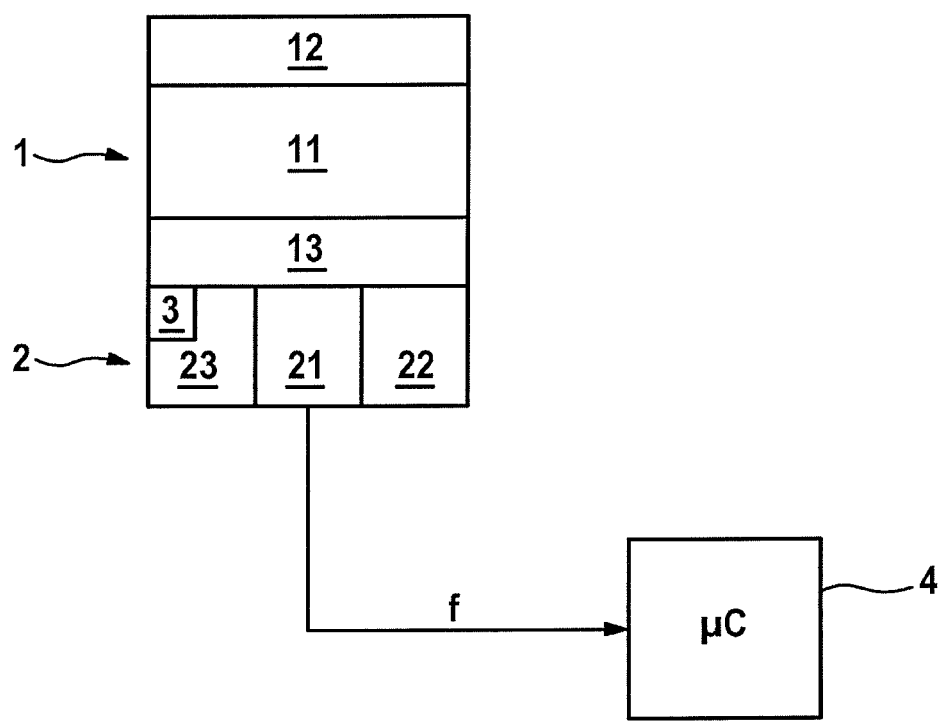

FREQUENCY GENERATOR ASSEMBLY

CROSS REFERENCE TO RELATED APPLICATIONS

This application is the U.S. National Phase Application of PCT International Application No. PCT/EP2012/074999, filed Dec. 10, 2012, which claims priority to German Patent Application No. 10 2011 089 813.1, filed Dec. 23, 2011, the contents of such applications being incorporated by reference herein.

FIELD OF THE INVENTION

The invention relates to a frequency generator assembly according to the precharacterizing clause of claim 1 and to the use of the frequency generator assembly in motor vehicles.

BACKGROUND OF THE INVENTION

It is known practice to use controlled crystal oscillators as frequency generator assemblies for generating an electrical clock signal.

SUMMARY OF THE INVENTION

An aspect of the invention proposes a frequency generator assembly which does not resort to such a relatively expensive crystal oscillator.

A sensor element which comprises the at least one micromechanical seismic mass of the oscillator is preferably understood as meaning an inertial sensor element; this sensor element is in the form of a rate-of-rotation sensor element, in particular.

The entire oscillator is preferably in the form of a micromechanical rate-of-rotation sensor element and the at least one seismic mass is designed and operated in such a manner that it is designed both to record a rate of rotation about at least one axis and, in particular simultaneously, is in the form of a seismic mass of the oscillator of the frequency generator assembly, in which case the electrical clock signal is generated or influenced on the basis of the oscillation frequency of this at least one seismic mass.

A clock signal is preferably understood as meaning an electrical binary signal, the alternating frequency of which is designed to be substantially constant, in particular, or alternatively is preferably designed to be changing or aperiodic.

The frequency generator assembly preferably comprises a control unit which is designed in such a manner that the oscillation of the at least one seismic mass of the oscillator is adjusted to a defined frequency value, in particular its natural frequency.

The oscillator preferably comprises a drive device which drives the at least one seismic mass or excites it to oscillate or influences the oscillation of the seismic mass, and a reading device which records the deflection of the at least one seismic mass with respect to the at least one oscillation mode. The drive device and the reading device are particularly preferably designed according to the electrostatic operating principle.

The oscillator and its at least one seismic mass, in particular its two seismic masses, are expediently designed and operated in such a manner that they are in the form of a micromechanical rate-of-rotation sensor element for a drive mode and a reading mode with respect to the design of the oscillator. In this case, the frequency generator assembly is particularly preferably designed in such a manner that the electrical clock signal is generated on the basis of the oscillation or oscillation frequency of the at least one seismic mass in its drive mode.

The frequency generator assembly is preferably designed in such a manner that the electrical clock signal is generated or influenced by a frequency multiplication unit. A frequency multiplication unit is understood as meaning, in particular, a unit for frequency conversion which particularly preferably need not have an integer form.

The frequency generator assembly preferably has a temperature sensor which is designed in such a manner that it directly or indirectly records the temperature of at least the oscillator in the environment/vicinity of the oscillator. In particular, the temperature sensor is linked in this case to the frequency multiplication unit via a calibration unit or interacts with such a calibration unit, and the frequency generator assembly is designed in such a manner that the frequency of the clock signal is set independently of the temperature of the oscillator and particularly preferably independently of the temperature dependence of the natural frequency of the oscillator.

The temperature sensor is expediently arranged in the signal processing device, in particular in the control unit in this case. The signal processing device or the control unit is particularly preferably connected and/or coupled to the oscillator in this case in a thermally conductive manner.

It is preferred for the frequency generator assembly to be connected to an external circuit unit comprising at least one microprocessor and to provide this circuit unit with the clock signal.

It is expedient that the external circuit unit is in the form of an external microcontroller, and this microcontroller is at least partially operated in a clocked manner by means of the clock signal from the frequency generator assembly.

It is preferred for the external circuit unit and the frequency generator assembly to belong to a sensor cluster or to form parts of a sensor cluster and, in particular, to have a common housing. In this case, this sensor cluster particularly preferably comprises at least one rate-of-rotation sensor element and at least one acceleration sensor element.

An aspect of the invention also relates to the use of the frequency generator assembly in motor vehicles, in particular for providing the clock signal for at least one external microcontroller and/or an external sensor assembly.

BRIEF DESCRIPTION OF THE DRAWINGS

Further preferred embodiments emerge from the subclaims and the following description of an exemplary embodiment using a FIGURE.

DETAILED DESCRIPTION OF THE PREFERRED EMBODIMENTS

FIG. 1 shows, in a schematic illustration, an exemplary frequency generator assembly comprising an oscillator 1 which is also in the form of a rate-of-rotation sensor element and is simultaneously used as such. A seismic mass 11 is excited to oscillate by means of the drive device 12, the frequency of which oscillation is adjusted to the natural frequency of the seismic mass by the control unit 23. The oscillator has a reading device 13 for this control circuit and for recording the deflections of the drive mode of the seismic mass 11 of the oscillator 1. This reading device 13 or oscillator 1 is connected to a signal processing device 2 which has a frequency multiplication unit 21 so that an electrical clock signal can be generated at a desired, defined frequency f on the basis of the regular oscillation frequency of the seismic mass. The frequency generator assembly also comprises a temperature sensor 3 which records the temperature of the oscillator 1 and provides a calibration unit 22 of the signal processing device 2 with this temperature information, as a result of which the clock signal f is generated independently of the temperature or in a temperature-compensated manner. In this case, the temperature sensor 3 is integrated in the control unit 23, for example, and is thermally coupled to the oscillator 1.

This clock signal f is made available to an external microcontroller 4, this microcontroller being operated in a clocked manner on the basis of this clock signal f or using this clock signal.

The invention claimed is:

1. A frequency generator assembly comprising:
at least one oscillator; and
an electronic signal processing device which is designed in such a manner that it provides an electrical clock signal at a defined frequency as an output signal from the frequency generator assembly, this defined frequency depending on an oscillation frequency of the oscillator,
the oscillator comprising at least one micromechanical seismic mass which is excited to oscillate using at least one drive device, after which the electronic signal processing device generates and provides the electrical clock signal on the basis of the oscillation frequency of the at least one seismic mass,
wherein the at least one micromechanical seismic mass is also a sensor for detecting at least one of rate-of-rotation and acceleration of the frequency generator assembly.

2. The frequency generator assembly as claimed in claim 1, wherein said assembly has a control unit which is designed in such a manner that the oscillation of the at least one seismic mass of the oscillator is adjusted to a defined frequency value.

3. The frequency generator assembly as claimed in claim 1, wherein the electrical clock signal is generated or influenced by a frequency multiplication unit.

4. The frequency generator assembly as claimed in claim 3, wherein the frequency generator assembly has a temperature sensor which is designed in such a manner that it directly or indirectly records the temperature of at least the oscillator.

5. The frequency generator assembly as claimed in claim 4, wherein the temperature sensor is linked to the frequency multiplication unit via a calibration unit, and the frequency generator assembly is designed in such a manner that the frequency of the clock signal, is set independently of the temperature of the oscillator.

6. The frequency generator assembly as claimed in claim 1, wherein the frequency generator assembly is connected to an external circuit unit comprising at least one microprocessor and provides the microprocessor unit with the clock signal.

7. The frequency generator assembly as claimed in claim 6, wherein the external circuit unit is in the form of an external microcontroller, and this microcontroller is at least partially operated in a clocked manner by the clock signal from the frequency generator assembly.

8. The frequency generator assembly as claimed in claim 6, wherein the external circuit unit and the frequency generator assembly belong to a sensor cluster and have a common housing.

9. The frequency generator assembly as claimed in claim 1, wherein the oscillator is in the form of one of a micromechanical rate-of-rotation sensor or an acceleration sensor.

10. The use of the frequency generator assembly as claimed in claim 1 in motor vehicles, for providing the clock signal for at least one external microcontroller and an external sensor assembly.

11. The frequency generator assembly as claimed in claim 1, wherein the defined frequency value is a natural frequency of the at least one seismic mass.

* * * * *